United States Patent [19]

Hatada et al.

[11] Patent Number: 4,766,426

[45] Date of Patent: Aug. 23, 1988

[54] DISPLAY PANEL ASSEMBLY HAVING A PLURALITY OF FILM CARRIER TAPES ON EACH OF WHICH A SEMICONDUCTOR DIVICE IS MOUNTED

[75] Inventors: Kenzo Hatada, Katano; Koji Matsunaga, Hirakata, both of Japan

[73] Assignee: Matsushita Electric Industrial Co., Ltd., Osaka, Japan

[21] Appl. No.: 829,819

[22] Filed: Feb. 14, 1986

[30] Foreign Application Priority Data

Feb. 14, 1985 [JP] Japan ................................ 60-26943
Feb. 27, 1985 [JP] Japan ................................ 60-38004

[51] Int. Cl.4 ............................................. G09G 3/00
[52] U.S. Cl. ..................................... 340/719; 340/718; 340/815.2; 361/398; 361/400
[58] Field of Search ............... 340/718, 719, 781, 783, 340/784, 815.2; 339/17 F; 368/223; 361/380, 398, 400, 401, 402, 403, 412; 29/577 C, 577 R, 589

[56] References Cited

U.S. PATENT DOCUMENTS

| 4,015,422 | 4/1977 | Van Haaften | 340/815.2 |
| 4,042,861 | 8/1977 | Yasuda et al. | 361/400 |
| 4,177,519 | 12/1979 | Kasubuchi et al. | 361/398 |
| 4,468,659 | 8/1984 | Ohba et al. | 340/719 |
| 4,470,856 | 9/1984 | Little et al. | 29/576 R |

Primary Examiner—Gerald L. Brigance
Assistant Examiner—Jeffery A. Brier
Attorney, Agent, or Firm—Wenderoth, Lind & Ponack

[57] ABSTRACT

A display panel assembly has a display panel, a printed circuit board, a plurality of semiconductor devices, and a plurality of film carrier tapes. The display panel has a plurality of electrodes. The printed circuit board is mounted on the display panel. The semiconductor devices are disposed between the electrodes of the display panel and the printed circuit board. Each film carrier tape has an opening and first and second lead group which extend from the tape in two opposite directions. Each lead group has a plurality of leads. One end of each lead group projects from the tape, and other end of each lead group projects into the opening. Each semiconductor device is mounted on a tape and is pressed to contact the electrodes. The one end of the second lead group is connected to the printed circuit board.

18 Claims, 3 Drawing Sheets

DISPLAY PANEL ASSEMBLY HAVING A PLURALITY OF FILM CARRIER TAPES ON EACH OF WHICH A SEMICONDUCTOR DIVICE IS MOUNTED

BACKGROUND OF THE INVENTION

This invention relates to a display device using liquid crystal, electroluminescence, or the like, and more particularly to a thin type display device on which a driving circuit for the liquid crystal, the composition exhibiting electroluminescence or the like is mounted.

Recently, display panels using liquid crystal or electroluminescence are being developed and commercialized. These display panels are so thin that they are easily assembled into a thin type appliance. However it is necessary to connect a semiconductor device for driving the display panel to a group of electrodes extending from the end of display panel. The number of these electrodes ranged, depending on the size of display panel, from hundreds to thousands. Such a semiconductor device for driving was assembled in a package such as a flat pack, and mounted on a printed circuit board nearly the same size as that of the display panel. The leads of this package are soldered to the wiring pattern formed on said printed circuit board. This wiring pattern is connected to the electrode disposed on the opposite side of the printed circuit board by way of a through-hole provided in the printed circuit board. The electrodes of the printed circuit board and those of the display panel are formed at equal intervals. Furthermore, the electrodes of the printed circuit board and those of the display panel are connected by elastic connectors alternately laminating conductive regions and insulating regions.

In such a method of construction, the package of the semiconductor device must increase in size as the number of leads is increased, making it hard to mount on the printed circuit board, and as a result, the entire display panel must be made larger. In addition, the electrodes of the printed circuit board must be formed one by one corresponding to those of the display panel. Actually, since electrodes must be formed at pitches of hundreds of micrometers ($\mu$m) on a side of tens of centimeters, and the electrode interval on the printed circuit board is subject to cumulative errors due to thermal expansion and other factors, a perfect connection could not be obtained, which led to connection troubles. Furthermore, there were many points of connection. For example, there were at least four points of connection, that is, wire bonding in the package of the semiconductor device, soldering of the package, and two connections of elastic connectors, which was a major cause in lowering the reliability.

In such a conventional construction, the structure of the display panel was extremely large, or the number of connections was too many, which causes a lower reliability of the connection. This occurs because there were too many constituent parts in the structure, and the true structure of the display panel could not be realized.

SUMMARY OF THE INVENTION

It is hence a primary object of this invention to present a display device which has a relatively small number of constituent parts and a relatively small number of connections.

This and other objects of the invention are accomplished by a display device which comprises a display panel having plural electrodes connected to an external circuit, an external printed circuit board provided to the display panel, a semiconductor device for driving the display panel disposed between the external circuit and the display panel, a support member for mounting the semiconductor device, and first and second lead groups composed of plural leads provided on the support member and extending in at least two directions, wherein the first lead group is connected to the electrodes on the display panel and the second lead group is connected to the external printed circuit board.

In the preferred embodiments, the first lead group is fixed to the electrodes on the display panel by soldering or adhering. The interval of the plural electrodes on the display panel is equal to that of the leads in the first lead group. The support member is a carrier tape used in a film carrier system or a tape automated bonding system. This support member has an opening, in which one-side ends of the leads of the first and second lead groups project and these lead groups are fixed to the support member. The electrodes of said semiconductor device are connected to the projected ends of these leads in the opening. The first lead group is press-fitted to the electrodes on the display panel by means of an elastic body, thereby electrically connecting the electrodes on the display panel and the first lead group. This elastic body is shaped like a bar. This bar elastic body is either a Viton rod or a silicon rod. The electric body is supported at the end of display panel by a C-shaped frame. Since the electric body is shaped like a bar, a groove to receive this bar elastic body is provided in the frame. Furthermore, the frame is composed of a first structure having the groove to receive the elastic body and a second structure which is engaged with the principal plane of the display panel, and integrally coupling these two structures, the frame presses down the elastic body and is supported at the end of the display panel. These two structures are integrally coupled by screws. A cover is provided at the back of the display panel, and said printed circuit board and a support member mounting said semiconductor device are attached to the cover. Grooves for disposition of the support member are provided at the side of the cover.

This invention provides various advantages, among which are as follows:

(1) Since the semiconductor device for driving is mounted by employing film carrier method or a tape automated bonding method and is disposed in the specified region of the display panel and the leads extended from the electrodes of said semiconductor device are joined to the electrodes on the display panel directly, there are only two points of connection, that is, at the electrode of the semiconductor device for driving and at the electrode of display panel, and the reliability associated with the connections is extremely high. Moreover, since the semiconductor device is mounted by the film carrier method, a thin and small packaged structure is realized.

(2) Since the leads extending from the semiconductor device for driving are directly connected to the electrodes on the display panel, the number of constituent parts is extremely decreased, while the number of manufacturing processes are reduced, so that the cost of the packaged structure may be lowered.

(3) At the junction of the electrodes of the display panel and the leads from the semiconductor device, since the positioning may be achieved over a short distances at every film carrier of each semiconductor device, conventional problems associated with a deviation in the interval of the electrodes on the printed circuit board and with dislocation of the electrodes on display panel are avoided.

(4) In case, incidentally, the semiconductor device is broken, it may be easily replaced only by removing the soldering of the lead to the film carrier.

(5) Positioning of the display panel electrodes and leads may be easily attained because there is no intervening object.

While the novel features of the invention are set forth particularly in the appended claims, the invention, both as to organization and content, will be better understood and appreciated, along with other objects and features thereof, from the following detailed description taken in conjunction with the drawings.

DETAILED DESCRIPTION OF THE PREFERRED EMBODIMENTS

Figure 1:
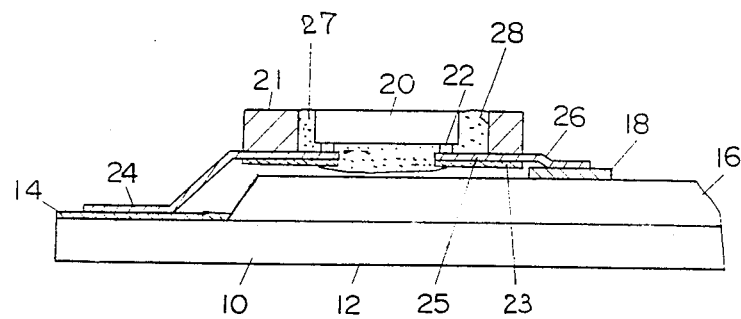
FIG. 1 is a sectional view of a display device according to one embodiment of the present invention.

The display device of a first embodiment of this invention is described below in reference to FIG. 1, wherein plural electrodes 14 are disposed parallel at the end of the back side of a flat display panel 10 comprised of liquid crystal, or exhibiting electroluminescence, or the like (the front display surface is 12). The back side of the display panel 10 is masked with a cover 16, and a printed circuit board 18 is attached to this cover 16. In case of an electroluminescence display panel, wet absorbing agent is accommodated in cover 16.

A semiconductor device 20 for driving the display panel 10 is mounted on a film tape 21, which is made of polyimid, using a film carrier system or a tape automated bonding system and is disposed in a specified region at the back side of the display panel 10. The electrodes 22 of semiconductor device 20 and leads 24 and 26 provided on the film tape 21 are joined together, and the interval between the electrodes 14 on display panel 10 and the interval between leads 24, to be connected, is the same so that the leads 24 contact the electrodes 14 on the display panel 10. An insulating layer (e.g., polyimid tape) 23 is disposed on the backside of leads 24, 26. Semiconductor device 20 is molded in synthetic resin 27. The other lead 26 on the film tape 21 is joined to the wiring board 18 disposed in a specified region on the back side of the display panel 10. That is, the lead 26 extending from the semiconductor device 20 is an input terminal for supplying an input signal and power for driving the semiconductor device 20, while the lead 24 is an output terminal for delivering signals to drive the display panel 10. In the display device, a plurality of semiconductor devices 20 mounted on said film tape 21 are disposed in at least one row.

Figure 2:
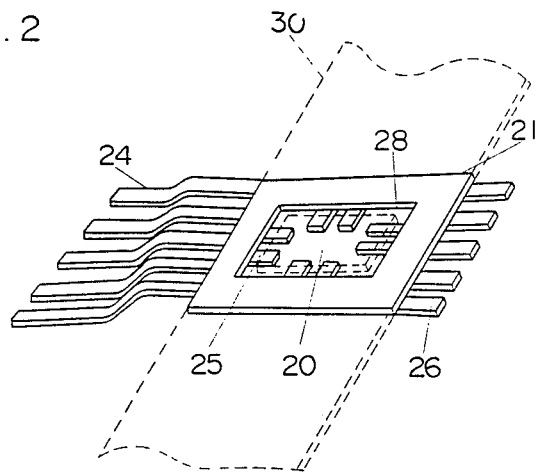
FIG. 2 is a perspective view of a semiconductor device for driving used in the device shown in FIG. 1.

Further describing the semiconductor device for driving mounted by employing the film carrier method as illustrated in FIG. 2, the semiconductor device 20 is joined with the ends 25 of leads 24, 26 projected into an opening 28 of the film tape 21. An Au protrusion or so-called bump having a thickness of 10 to 30 $\mu$m is formed on the electrode 22 of said semiconductor device 20 by way of a multiple metal layer such as Ti-Pd-Au and Cr-Cu-Au. A copper foil is adhered to the film tape 21, and this copper foil is etched, and leads 24, 26 are formed, and these leads are plated with Sn, and said lead ends 25 and the bump are joined together by an Au-Sn alloy. The semiconductor device 20 may be disposed on the underside of leads 24, 26. Incidentally, in this embodiment, the thickness of tape 21 is 0.125 mm and the thickness of the semiconductor device 20 is 0.3 mm.

The lead 26 which is the input terminal to the semiconductor device 20 and the lead 24 which is the output terminal project from the semiconductor device in mutually different directions (that is, in two directions), and the leads 24 are spaced at the same interval as are the electrode interval on the display panel. In the construction shown in FIG. 2, a plurality of leads formed on a long film 30 are cut to extend in a specified direction. Or, one lead 24 contacting the electrode of the display panel in FIG. 2 does not have any film carrier left over at its end. Rather, the film carrier may be left over so as to fix the lead end to the end of said lead 24.

The electrode 14 of display panel 10 and lead 24 are joined either by soldering or by means of adhesive or the like.

Figure 3:
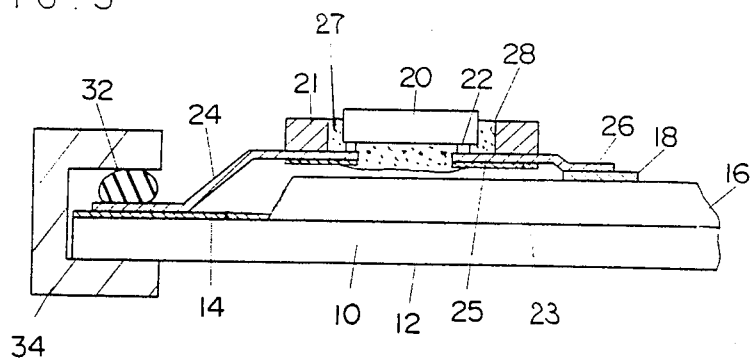
FIG. 3 is a sectional view of a display device according to another embodiment of the present invention.

FIG. 3 shows another embodiment of the method of joining the electrode 14 of display panel 10 and lead 24, in which the electrode 14 of display panel 10 and lead 24 are positioned, and an elastic body 32 made of silicone or the like is placed on said lead 14 and is press-fitted by means of a C-shaped frame 34.

Figure 4:
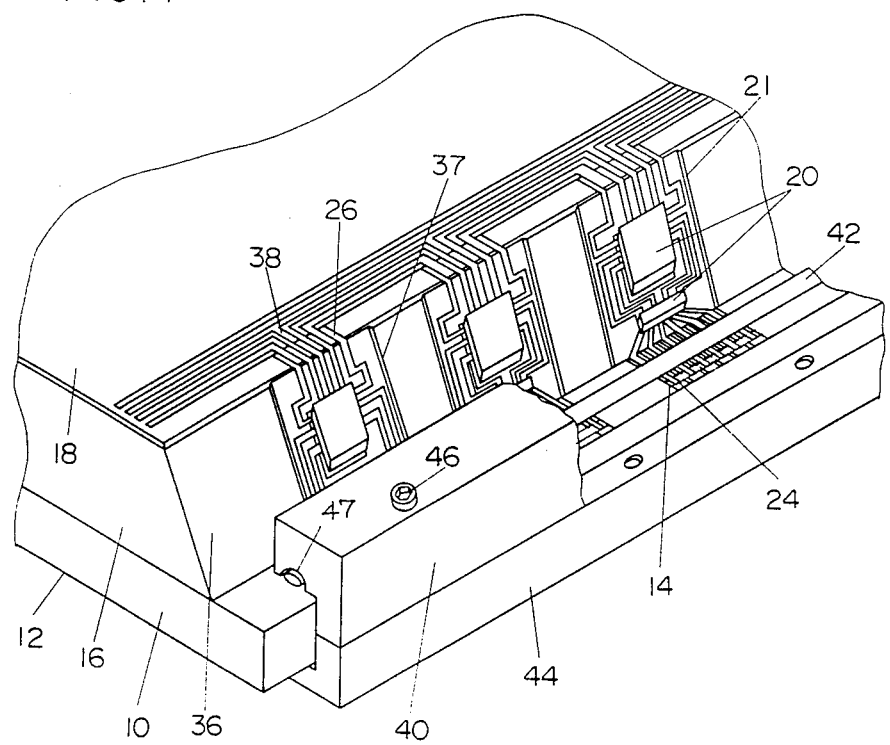
FIG. 4 is a perspective view of a display device according to a further embodiment of the present invention.
Figure 5:
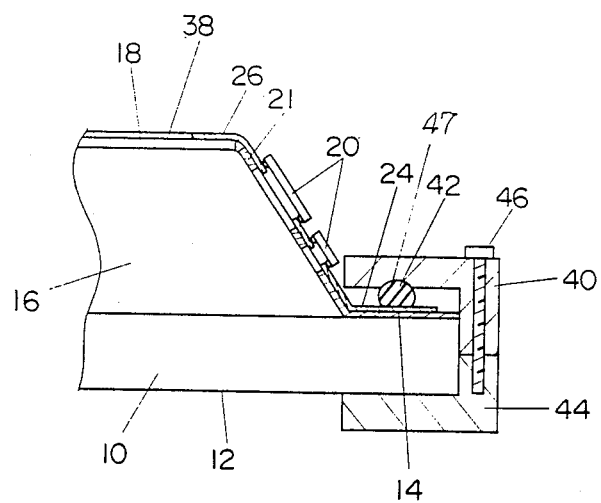
FIG. 5 is a sectional view of the device shown in FIG. 4.
Figure 6:
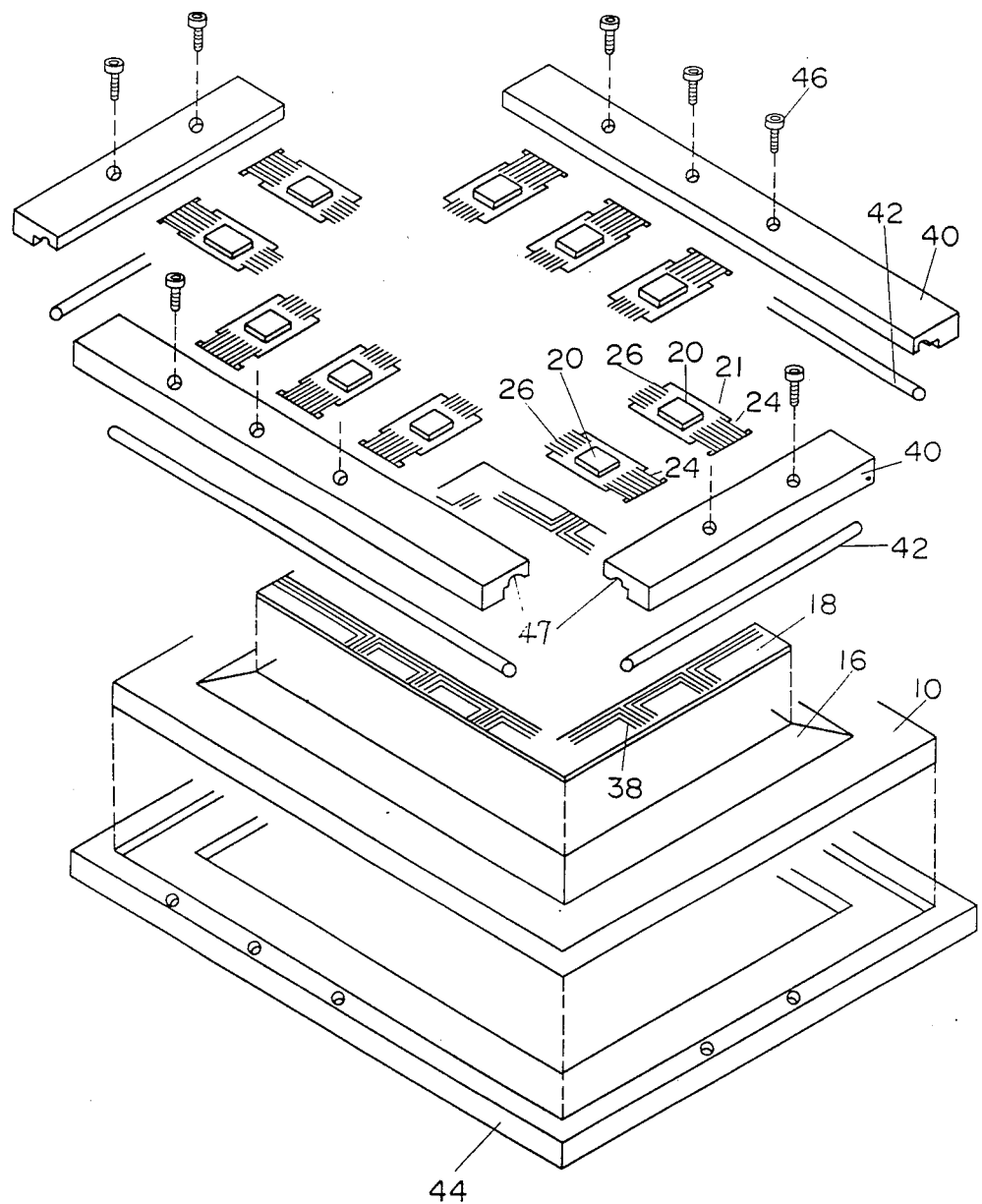
FIG. 6 is an exploded perspective view of the device shown in FIG. 4.

A further embodiment of the display device of this invention is described in FIGS. 4 to 6, in which, for the sake of simplicity, the same constituent parts as in FIGS. 1 to 3 are identified with the same numbers and are not specifically explained herein. In the device shown in FIGS. 4 to 6, a plurality of film carriers 21 having leads 24, 26 extending in two directions are disposed on an end oblique plane 36 of a cover 16 provided on the back side of the display panel 10. Two semiconductor devices 20 are mounted on one film carrier 21, and these semiconductor devices are mutually electrically connected by being wired along the circuit pattern on the film carrier 21. One of the leads, 26, is connected to a circuit pattern 38 formed on a printed circuit board 18, while another lead 24 has its bottom contacting an electrode group 14 on display panel 10 and its top contacting an elastic body 42 of a frame 30 and is press-fixed by a frame 44. The two frames 44, 46 are fastened by means of screw 46.

As the display panel 10, an electroluminescent display panel having 256 scanning electrodes at a pitch of 0.32 mm and 1024 external lead-out electrodes 14 for signal electrodes is used. The material comprising the electrodes 14 is either Cr or ITO. The material comprising cover 16 and frames 40, 44 is Al. A groove 47 is provided in the frame 40, and an elastic body 42 comprised of a Viton rod (2 mm$\phi$) or silicone is inserted into this groove.

The film carrier 21 is prepared by forming a copper foil pattern 37 on a polyimide film and plating with tin or Au. Bumps comprised of a Ti-Pd-Au composition are formed on the electrodes 22 of the semiconductor device 20, and are connected with the leads of the film carrier 21 by means of an Au-Sn or Au-Au alloy Forty film carriers (8 pieces at a scanning side and 32 pieces at a signal side) are buried in the grooves 37 provided in the cover 16, and one end of lead 24 is mounted on the external lead-out electrode 14, and the end of lead 26 is connected to the printed circuit board 18 while the frames 40 and 44 are secured by means of the screw 46 by press-fitting the lead group 24 and electrode group 14 by means of the elastic body 42 of the frame 40.

When thus packaged, and when the electroluminescent display panel was driven with a driving voltage of 100 V and a maximum current of 80 mA, satisfactory driving was achieved. At this time, the connection resistance was not more than 1 ohm regardless of the electrode material, and it was not more than twice the intial value after 1000 hours of withstanding 125° C. and 80° C. storage temperatures, 85% storage.

In the embodiments, the film carrier tape 21 is fixed to the groove 37 provided in the cover 16, but it may be also possible to fix the film carrier tape by forming a protrusion on the frame 40, making a hole to be matched with this protrusion in the film carrier 21, and putting the film carrier hole over this protrusion of the frame 40. Or, since the position at which the lead group 26 is connected on the printed circuit board 18 can be predetermined, the lead group 24 and electrode group 14 on the display panel may be automatically positioned when connecting the lead group 26 to the printed circuit board 18 without providing a groove or protrusion to define the position of film carrier 21 on the cover 16 of the display panel as mentioned above.

Moreover, in the embodiments, the frames 40, 44 are joined together by means of screw, but they may also be joined by fit-in type or by means of a fixing jig. Incidentally, the material comprising the frames 40, 44 and cover 16 are Al, but this is not required, and the material may also be Cu, SUS, Fe, ceramics, resins or the like. As the elastic body, in addition, silicone rubber and other elastic materials having a relatively good heat resistance may be used. Leads 24 are position-controlled by a part 21A of film tape 21. By use of this part 21A, deviation of leads 24 in sideways direction is prevented.

In such a construction, facilities for the treatment of electrodes of the display panel, heating jig and for soldering are not necessary.

While specific embodiments of the invention have been illustrated and described herein, it is realized that modifications and changes will occur to those skilled in the art. It is therefore to be understood that the appended claims are intended to cover all modifications and changes as fall within the true spirit and scope of the invention.

What we claim is:

1. A display panel assembly comprising:
a display panel having a plurality of electrodes;
a printed circuit board connected to said display panel;
a plurality of semiconductor devices disposed between said electrodes and said printed circuit board;
a plurality of film tapes each having an opening extending therein;
first and second lead groups extending from each of the film tapes;
the first and second lead groups of each respective one of the film tapes extending in different directions from one another, each of the lead groups comprising a plurality of leads, one end of each of the leads of each of said lead groups of the respective one of the film tapes projecting into the opening of that film tape, the other end of each of the leads of the first lead group of each of the film tapes projecting from the respective film tapes and contacting said electrodes, the other end of each of the leads of the second lead group of each of the film tapes operatively electrically connected to said printed circuit board, said semiconductor devices each disposed in respective ones of said openings of the film tapes and in operative electrical contact with said one end of each of the leads of each of said lead groups projecting into said openings; and
means for pressing the other end of each of the leads of the first lead group of each of the film tapes against said electrodes to maintain an operative electrical connection therebetween.

2. A display device as claimed in claim 1, wherein said plurality of electrodes are spaced apart from one another on said display panel at intervals that correspond to intervals over which the other ends of the leads of the first lead groups are spaced apart from one another.

3. A display device as claimed in claim 1, wherein said plurality of film tapes comprise a carrier tape of a film carrier system.

4. A display device as claimed in claim 1, wherein said pressing means comprises an elastic body urged against said other ends of each of the leads of the first lead group of each of the film tapes.

5. A display device as claimed in claim 4, wherein said elastic body is bar-shaped.

6. A display device as claimed in claim 5, wherein said elastic body is comprised of one of a Viton rod and a silicon rod.

7. A display device as claimed in claim 4, wherein said pressing means further comprises a C-shaped frame for biasing said elastic body against said other end of each of the leads of the first lead group of each of the film tapes thereby deforming the elastic body.

8. A display device as claimed in claim 7, wherein said elastic body is bar-shaped, said C-shaped frame has a groove extending therein, and said bar-shaped elastic body extends in said groove.

9. A display device as claimed in claim 8, wherein said frame comprises a first structure in which said groove extends, a second structure extending over and engaging a front surface of the display panel on which a display is displayed, and means for coupling said first structure to said second structure at a side edge of the display panel and for urging the frame against the display panel to press the elastic body extending in said groove against said other end of each of the leads of the first lead group.

10. A display device as claimed in claim 9, wherein said means for coupling are screws.

11. A display device as claimed in claim 1, and further comprising a cover extending over a back surface of the display panel, said printed circuit board and said plurality of film tapes being attached to said cover.

12. A display device as claimed in claim 11, wherein said cover has a grooved section in which said film tapes are disposed.

13. A display device comprising:
a display panel having a plurality of electrodes;
an external printed circuit board operatively electrically connected to said display panel;
a semiconductor device operatively electrically connected between said external printed circuit board and said display panel for driving the display panel;
a support member to which said semiconductor device is mounted;
first and second lead groups each comprised of plural leads provided on said support member, the leads of said first lead group and the leads of said second lead group extending in respective directions that are different from one another, first ends of the leads of said first lead group projecting from said support member toward said electrodes;
the semiconductor device mounted to said support member being operatively electrically connected to said first and said second lead groups;
an elastic body for urging said first lead group against said plurality of electrodes for establishing an operative electrical contact between the first lead group and said plurality of electrodes; and
a frame secured to a side edge of the display panel for pressing the elastic body against said plurality of electrodes.

14. A display device as claimed in claim 13, wherein said elastic body is bar-shaped.

15. A display device as claimed in claim 13, wherein said frame is C-shaped.

16. A display device as claimed in claim 13, wherein said frame comprises a first structure in which a groove extends, a second structure extending over and engaging a front surface of the display panel on which a display is displayed, and means for coupling said first structure to said second structure at a side edge of the display panel and for urging the frame against the display panel to press the elastic body extending in said groove against said leads of the first lead group.

17. A display device comprising:
a flat display panel having a plurality of electrodes;
an external printed circuit board operatively electrically connected to said display panel;
a semiconductor device operatively electrically connected between said external printed circuit board and said display panel for driving the display panel;
a support member to which the semiconductor device is mounted;
first and second lead groups each comprised of plural leads provided on said support member, the leads of said first lead group and the leads of said second lead group extending in respective directions that are different from one another, first ends of the leads of said first lead group projecting from said support member toward said electrodes;
the semiconductor device mounted to said support member being operatively electrically connected to said first and said second lead groups;
a bar-shaped elastic body for urging said first lead group against said plurality of electrodes for establishing an operative electrical contact between the first lead group and said plurality of electrodes; and
a frame secured to sides of the flat display panel for pressing said elastic body against said first lead group,
said frame comprising a first structure in which a groove extends, the bar-shaped elastic body extending in said groove, a second structure extending over and engaging a front surface of the flat display panel on which a display is displayed, and means for coupling said first structure to said second structure and for urging the frame against the sides of the display panel to press the elastic body extending in the groove against said first lead group.

18. A display device as claimed in claim 17, wherein said second structure is shaped like a picture frame having a stepped recess extending there around in which said flat display panel is disposed.

* * * * *